(12) United States Patent
Barsun et al.

(10) Patent No.: US 7,095,622 B2
(45) Date of Patent: Aug. 22, 2006

(54) BACKPLANE SUPPORT SYSTEM WITH STIFFENER

(75) Inventors: Stephan K. Barsun, Davis, CA (US); Robert W. Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 31 days.

(21) Appl. No.: 10/458,932

(22) Filed: Jun. 11, 2003

(65) Prior Publication Data

US 2004/0253842 A1   Dec. 16, 2004

(51) Int. Cl.
*H01R 12/16* (2006.01)
(52) U.S. Cl. ..................................... 361/788
(58) Field of Classification Search ............. 439/61; 361/788, 752, 749, 801, 802, 829, 784, 785, 361/828, 690–695
See application file for complete search history.

(56) References Cited

U.S. PATENT DOCUMENTS

| | | | |
|---|---|---|---|
| 3,539,879 A * | 11/1970 | Bradley ....................... 361/756 |
| 4,241,381 A * | 12/1980 | Cobaugh et al. ............ 361/785 |
| 4,268,100 A * | 5/1981 | Kekas et al. ................. 439/61 |
| 4,314,402 A | 2/1982 | Lemmer |
| 4,353,614 A * | 10/1982 | Etchison et al. ......... 439/540.1 |
| 4,398,779 A * | 8/1983 | Ling ........................... 439/64 |
| 4,527,285 A * | 7/1985 | Kekas et al. ................ 398/164 |
| 4,712,848 A | 12/1987 | Edgley |
| 4,988,577 A | 1/1991 | Jamieson |
| 5,023,754 A * | 6/1991 | Aug et al. ................... 361/800 |
| 5,027,254 A * | 6/1991 | Corfits et al. ............... 361/694 |
| 5,136,470 A * | 8/1992 | Sheridon et al. ............ 361/749 |
| 5,186,377 A | 2/1993 | Rawson et al. |
| 5,186,654 A | 2/1993 | Enomoto et al. |
| 5,198,279 A | 3/1993 | Beinhaur et al. |
| 5,247,427 A * | 9/1993 | Driscoll et al. ............. 361/685 |
| 5,337,388 A * | 8/1994 | Jacobowitz et al. .......... 385/76 |
| 5,378,545 A | 1/1995 | Akulow |
| 5,453,580 A | 9/1995 | Franke et al. |
| 5,535,100 A | 7/1996 | Lubahn et al. |
| 5,557,503 A | 9/1996 | Isaacs et al. |
| 5,567,166 A | 10/1996 | Lemke |
| 5,669,775 A * | 9/1997 | Campbell et al. ............ 439/77 |
| 5,673,182 A * | 9/1997 | Garner ....................... 361/829 |
| 5,748,451 A * | 5/1998 | Thompson et al. ......... 361/788 |
| 5,768,777 A | 6/1998 | Lemke |
| 5,808,876 A * | 9/1998 | Mullenbach et al. ....... 361/788 |
| 5,893,466 A | 4/1999 | May et al. |
| 6,038,126 A * | 3/2000 | Weng ......................... 361/679 |
| 6,058,014 A | 5/2000 | Choudhury et al. |
| 6,082,695 A * | 7/2000 | Leong .................... 248/346.01 |
| 6,084,182 A | 7/2000 | Rehlander |
| 6,155,858 A | 12/2000 | Ozawa et al. |

(Continued)

OTHER PUBLICATIONS

IBM Technical Disclosure, Allen et al, vol. 19, No. 1, p. 51, Jun. 1976.*

*Primary Examiner*—Neil Abrams

(57) ABSTRACT

An electronic system includes a chassis, a backplane having a printed circuit board and at least one connector extending from the printed circuit board and a backplane stiffener. The backplane stiffener includes a portion adjacent the printed circuit board, wherein the printed circuit board is between the chassis and the portion. The portion is stationarily retained relative to the printed circuit board and the chassis without requiring perforation of the printed circuit board for the insertion of fasteners. In particular embodiments, stiffener portions may be provided on each face of the circuit board and joined to one another by couplers.

80 Claims, 6 Drawing Sheets

U.S. PATENT DOCUMENTS

| | | |
|---|---|---|
| 6,162,090 A | 12/2000 | Klubenspies et al. |
| 6,234,809 B1 | 5/2001 | Futatsugi |
| 6,260,265 B1 | 7/2001 | Kownacki et al. |
| 6,285,563 B1 * | 9/2001 | Nelson et al. ............... 361/784 |
| 6,335,868 B1 * | 1/2002 | Butterbaugh et al. ....... 361/796 |
| 6,362,968 B1 | 3/2002 | Lajara et al. |
| 6,366,464 B1 * | 4/2002 | Cosley et al. ................ 361/752 |
| 6,459,589 B1 * | 10/2002 | Manweiler et al. ......... 361/752 |
| 6,512,676 B1 | 1/2003 | Crapisi et al. |
| 6,512,678 B1 * | 1/2003 | Sims et al. .................. 361/759 |
| 6,535,397 B1 * | 3/2003 | Clark et al. ................. 361/788 |

* cited by examiner

BACKPLANE SUPPORT SYSTEM WITH STIFFENER

BACKGROUND OF THE INVENTION

Electronic systems, such as networking systems and data storage systems, typically include a chassis, a backplane, secondary or daughter cards and a variety of peripherals such as disc drives, auxiliary backplanes, displays and the like. The backplane, also known as a processor board, mother board, system board or main board, depending upon its function and configuration, is a relatively thin, flat sheet structure including one or more connectors for connection to daughter cards and peripherals, either directly or via cables. In addition, many backplanes support a variety of passive and active components. Examples of active components include one or more processors or central processing units or chips to direct signals. Some processors further include power conditioning modules with heat sinks.

The localized weight of the daughter cards and processors subject the backplane to bending and flexing stresses during assembly of the electronic equipment. The plugging and unplugging of secondary cards and peripherals to the backplane further subjects the backplane to bending and flexing stresses due to connector mate and un-mate forces.

A variety of structures are known for stiffening the backplane to enable the backplane to withstand such stresses and bending forces. Such stiffeners typically include one or more stiffening members which are directly fastened to the backplane through a large number of mounting holes within the backplane. Examples of such stiffeners are disclosed in U.S. Pat. Nos. 6,260,265; 6,084,182; and 6,512,676.

DETAILED DESCRIPTION OF THE EXAMPLE EMBODIMENTS

Figure 1:
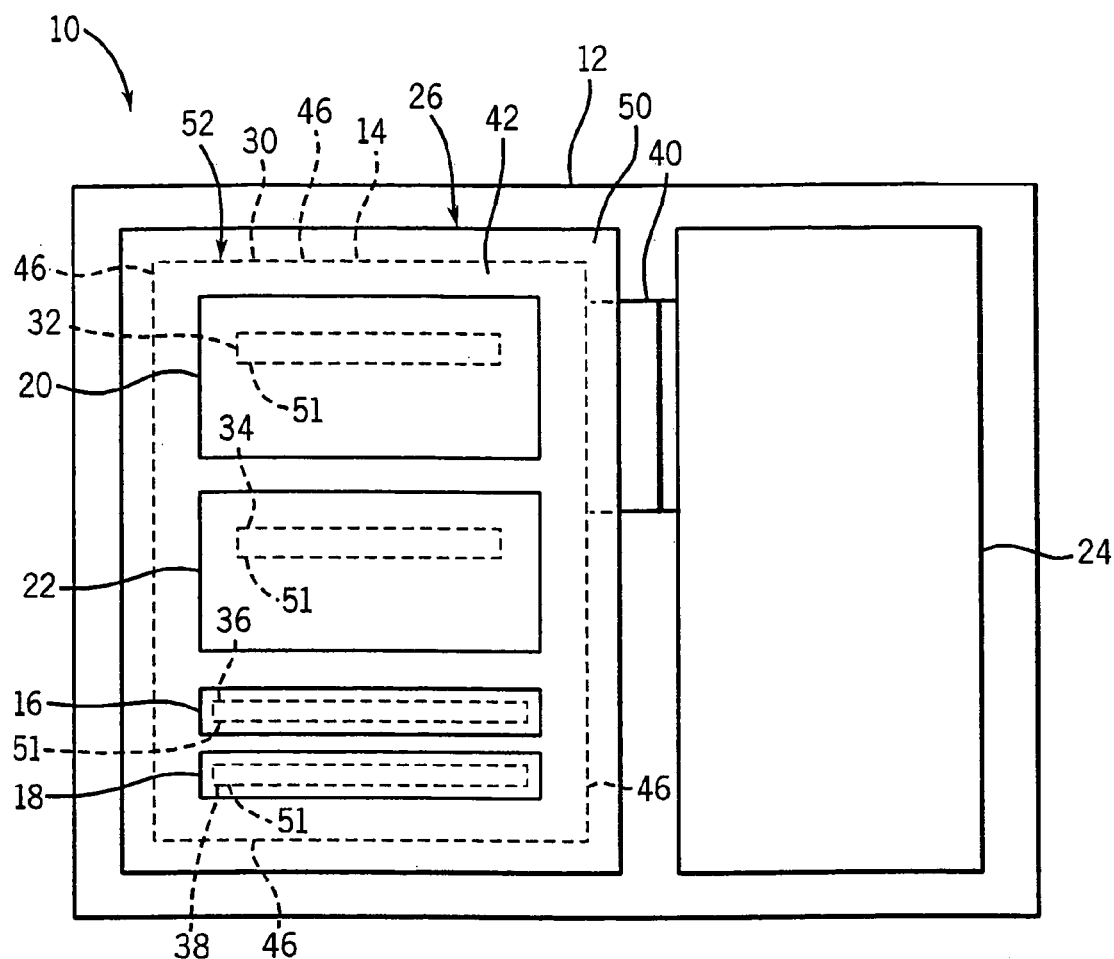
FIG. 1 is a top plan view schematically illustrating an example of an electronic system of the present invention.

FIG. 1 schematically illustrates an electronic system such as a computer system 10. Computer system 10 includes chassis 12, backplane 14, secondary cards 16, 18, peripheral devices 20, 22 and 24, and backplane stiffener 26. Depending upon the particular type of computer system 10 or its intended functions, computer system 10 may include a greater number or a few number of secondary cards or peripherals. In addition, computer system 10 may include alternative system components or devices which may or may not be connected to backplane 14.

Chassis 12 generally comprises one or more structures configured to enclose and/or support the main internal system components or system devices of system 10. Chassis 12 may include a plurality of panels which extend about backplane 14, secondary cards 16, 18, peripherals 20, 22, 24 and stiffener 26. In addition, chassis 12 may include an internal framework to which the aforementioned devices may be mounted. The overall shape, size and configuration of chassis 12 depends upon the size, number and type of system components supported or enclosed by chassis 12 and the intended function or operation of computer system 10.

Backplane 14 is located within chassis 12 and comprises a conventionally known or future developed backplane which generally includes a printed circuit board 30 and a plurality of connectors 32, 34, 36, 38 and 40. Although not illustrated, backplane 14 may additionally include a plurality of both active and passive components connected to printed circuit board 30. Connectors 32, 34, 36, 38 and 40 comprise conventionally known or future developed connectors or connector portions that are affixed to printed circuit board 30 and that extend from printed circuit board 30.

Printed circuit board 30 comprises a conventionally known or future developed circuit board and is generally a relatively thin, flat sheet of one or more layers including multiple electrically conductive traces. In other embodiments, printed circuit board 30 may utilize other lines for transmitting data signals in lieu of electrically conductive lines. Examples include optical or photo conductive lines. Printed circuit board 30 has a first face 42, an opposite face (not shown) and sides or edges 46 to form a perimeter 48 of printed circuit board 30.

Printed circuit board 30 is supported within chassis 12 and is stationarily coupled to chassis 12. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. In one embodiment, printed circuit board 30 is directly and stationarily coupled to chassis 12 by standoffs (shown in FIG. 2). In another embodiment, printed circuit board 30 may be indirectly but stationarily coupled to chassis 12 by additional intermediate structures. Alternatively, printed circuit board 30 and backplane 14 may be movable relative to chassis 12 in one direction, wherein stiffener 26 rigidifies and supports printed circuit board 30 in another direction. In one embodiment, printed circuit board 30 and backplane 14 may be configured to move relative to chassis 12 prior to being releasably clamped or otherwise held in place relative to chassis 12. An example of such a movable backplane is disclosed in co-pending U.S. patent application Ser. No. 10/442,036 filed on May 20, 2003 by Bryan D. Bolich and Kenneth G. Robertson, entitled "Computer System with Slidable Motherboard," the full disclosure of which is hereby incorporated by reference. In still other embodiments, as will be described hereafter, printed circuit 30 may be stationarily and indirectly coupled to chassis 12 by a stiffener 26, wherein stiffener 26 is itself stationarily coupled to chassis 12.

Connectors 32, 34, 36 and 38 extend away from surface 42 while connector 40 extends from an edge 46 of printed circuit board 30 beyond perimeter 48. Connectors 32, 34 and 40 are generally configured to connect peripherals to printed circuit board 30. Connectors 32, 34 and 40 are configured to mate with corresponding connectors of peripherals 20, 22 and 24, respectively. Each mating pair of connectors generally has predetermined or known insertion and extraction forces. Connectors 36 and 38 are generally configured to connect secondary cards or daughter cards to printed circuit board 30. Connectors 36 and 38 are configured to mate with corresponding connectors on secondary cards 16 and 18, respectively. Such pairs of mating connectors have known insertion and extraction forces that occur during connection and disconnection. The actual number, size and type of connectors affixed to printed circuit board 30 may vary depending upon size, type and number of peripherals and/or secondary cards to be connected to printed circuit board 30 or components supported by circuit board 30.

Secondary cards 16, 18 generally comprise conventionally known or future developed secondary or daughter cards configured to be connected to printed circuit board 20 by connectors 36 and 38, respectively. Examples of secondary cards include input/output cards, memory cards such as dual inline memory modules (DIMMS), memory extenders, processor boards, and the like.

Peripherals 20, 22 and 24 generally comprise devices which provide one or more functions and which are connected to backplane 14 either directly or by intermediate cables. In the particular embodiment illustrated in FIG. 1, each of peripherals 20, 22 and 24 is illustrated as being directly connected to backplane 14 by connectors 32, 34 and 40, respectively. Examples of peripherals include permanent disk drives such as hard disk drives, removable disk drives such as CD or DVD drives, other forms of removable memory such as floppies, displays, and auxiliary backplanes.

Backplane stiffener 26 generally comprises one or more members having portions which are configured to extend adjacent to and along at least one of faces 42 and 44 of printed circuit boards 30, wherein the portions have a rigidity greater than the rigidity of printed circuit board 30 so as to stiffen circuit board 30. At least portions of the backplane stiffener 26 are held stationary relative to the printed circuit board 30 without requiring perforation of the printed circuit board 30. As a result, the number of perforations or holes passing through printed circuit board 30 for the purpose of securing a stiffening member adjacent to circuit board 30 is reduced or completely eliminated. By reducing or completely eliminating the number of apertures passing through circuit board 30, stiffener 26 facilitates denser routing of communication lines, such as electrically conductive traces, on printed circuit board 30 since such traces do not have to bypass mounting holes. In contrast to stiffeners that utilize high force connectors or fasteners that pass through the printed circuit board to mount the stiffener to the printed circuit board, stiffener 26 does not utilize fasteners that create high forces and stress around mounting holes that may damage board 30 or the traces upon board 30. As a result, stiffener 26 provides more uniform support across printed circuit 30.

In the embodiment illustrated in FIG. 1, stiffener 26 comprises a relatively rigid (more rigid than printed circuit board 30) panel extending across face 42 of printed circuit board 30 between printed circuit board 30 and devices releasably connected to printed circuit board 30 such as secondary cards 16, 18 and peripherals 20, 22. To facilitate such connection, stiffener 26 includes apertures 51 located and sized to enable connectors 32, 34, 38 and 48 to be connected to peripherals 20, 22, 18 and 16, respectively. In the particular embodiment illustrated, apertures 51 are configured such that connectors 32, 34, 38 and 48 at least partially project into apertures 51 or extend completely through apertures 51. As shown by FIG. 1, apertures 51 are completely surrounded by stiffener member 26. As a result, stiffener member 26 provides uniform support completely about each of connectors 32, 34, 38 and 48. In alternative embodiments, one or more of apertures 51 may only be partially surrounded by stiffener 26. For example, one of apertures 51 may be formed by a continuous cut-out extending from an edge of stiffener 26. The exact size, location and configuration of apertures 51 will depend upon the size, location and configuration of the connectors to be accommodated.

Stiffener 26 is stationarily coupled to chassis 12. In one embodiment, portion 50 of stiffener 26 is directly coupled to chassis 12. In another embodiment, stiffener 26 includes a second portion (not shown) that extends adjacent to a face opposite face 42 which is coupled to both portion 50 and chassis 12.

Figure 2:
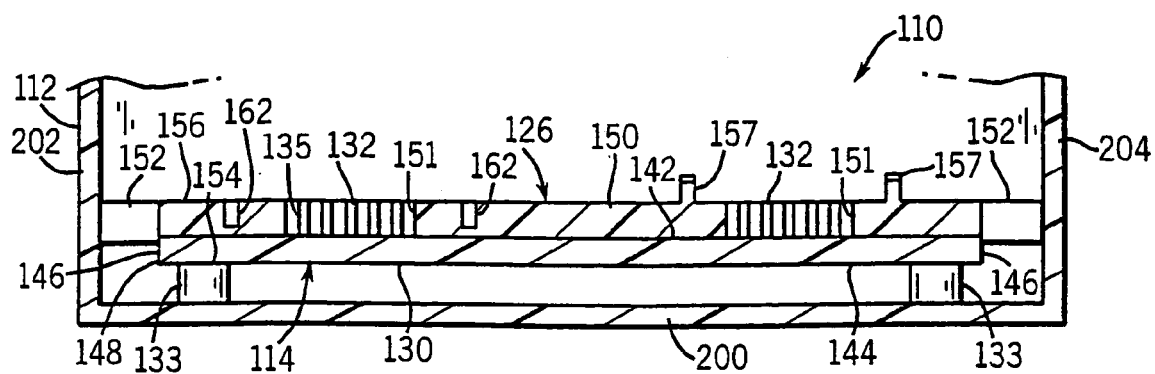
FIG. 2 is a sectional view schematically illustrating a first alternative embodiment of the electronic system of FIG. 1.

FIG. 2 is a sectional view schematically illustrating computer system 110, a first alternative embodiment of computer system 10 shown in FIG. 1. Computer system 110 generally includes chassis 112, backplane 114, and stiffener 126. System 110 additionally includes devices to be connected to backplane 114 such as secondary cards or peripherals including auxiliary circuit boards, disk drives, floppy drives, displays and the like (not shown). Chassis 112 generally comprises one or more structures configured to support and at least partially enclose the remaining internal components of computer system 110. Chassis 112 includes walls 200, 202 and 204. Walls 200, 202 and 204 may each serve as either a floor, sidewall or ceiling of chassis 112 depending on the particular orientation of chassis 212. Moreover, walls 200, 202 and 204 may alternatively comprise interiorly extending framework along backplane 114, wherein one or more of walls 200, 202 and 204 does not serve as an outer enclosing wall of chassis 112.

Backplane 114 extends along wall 200 between walls 202 and 204. Backplane 114 includes printed circuit board 130 and connectors 132. Printed circuit board 130 is stationarily coupled to chassis 112 by standoffs 133. Printed circuit board 130 has a top face 142, a bottom face 144 and side edges 146 which form perimeter 148.

Connectors 132 generally comprise conventionally known or future developed connectors affixed to surface 142 of printed circuit board 130. In the particular embodiment illustrated, connectors 132 comprise a plurality of male pins 135 configured to mate and be received within a plurality of female pin receptacles of another connector associated with another device to be connected to printed circuit board 130 such as a secondary card or a peripheral. In alternative embodiments, connector 132 may have various other sizes, shapes or configurations depending upon the device intended to be connected to printed circuit board 130 using a particular connector 132. Although backplane 114 is illustrated as including two identical connectors 132, connectors 132 may alternatively have different configurations from one another.

Stiffener 126 is positioned adjacent to printed circuit board 130 of backplane 114 and includes stiffening portion 150 and coupling portions 152. Stiffening portion 150 generally comprises a rigid member supported adjacent to face 142 of printed circuit board 130 so as to stiffen circuit board 130 of backplane 114. Stiffening portion 150 has a rigidity or stiffness greater than the rigidity or stiffness of circuit board 130 of backplane 114. In one particular embodiment, stiffening portion 150 has a rigidity such that for known insertion forces, the backplane will not flex such that it or board 130 is damaged or the connectors bind. The necessary rigidity will vary given the connectors used, the span between support points, and the insertion and extraction forces generated by the connectors. Stiffening portion 150 may be made from a variety of materials, layers of different materials or composites of different materials to provide the necessary rigidity or stiffness to stiffening portion 150. Examples include polymers, metals, wood and the like.

As further shown by FIG. 2, stiffening portion 150 extends over substantially the entire face 142 of printed circuit board 130 except for apertures 151. Apertures 151 are sized, located and configured to facilitate connection of other devices to printed circuit board 130 via connectors 132. In the embodiment illustrated, apertures 150 are completely-surrounded by stiffener portion 150 to provide support to printed circuit board 130 continuously about connectors 132. In alternative embodiments, apertures 152 may comprise cutouts continuously extending from the perimeter edge of stiffener portion 150.

Although FIG. 2 illustrates stiffening portion 150 as generally comprising an imperforate panel or member continuously extending over the entire face 142 of printed circuit board 130, stiffening portion 150 may have other configurations depending upon stiffening demands of printed circuit board 130 as well as varying characteristics of the components supported by printed circuit board 130. For example, in alternative embodiments, stiffening portion 150 may include additional openings extending completely through stiffening portion 150 to accommodate various active or passive components projecting from face 142 of printed circuit board 130. In alternative embodiments, stiffening portion 150 may alternatively include a plurality of perforations to facilitate cooling of components on printed circuit board 130. Such perforations may result in stiffener portion 150 having a honeycombed appearance. Stiffener portion 150 may alternatively comprise a framework or latticework of stiffening members that extend at least partially across face 142 of printed circuit board 130.

Although stiffening portion 150 is illustrated as a generally flat planar member, stiffening portion 150 may have various other configurations. For example, surface 154 of stiffening portion 150 may have depressions or cavities extending into surface 154 for accommodating active or passive components projecting from face 142 of printed circuit board 130. Surface 156 of stiffening portion 150 may include cavities or protuberances to facilitate gripping or handling of stiffening portion 150 or to facilitate alignment of other devices upon stiffening portion 150. For example, stiffener 126 may additionally include alignment pins 157 coupled to surface 156 to facilitate alignment of peripherals and their connectors to connectors 132 of backplane 114. In particular applications, such alignment pins 157 may be coupled to surface 156 by being integrally formed as part of a single unitary body with stiffening portion 150. In other embodiments, stiffening portion 150 may be provided with alignment receptacles 162 configured to receive alignment pins projecting from devices to be connected to printed circuit board 130 via connectors 132.

Coupling portions 152 comprise structures fixedly coupled between stiffening portion 150 and chassis 112 so as to stationarily support or secure stiffening portion 150 relative to printed circuit board 130 of backplane 114. Although coupling portions 152 are schematically illustrated as blocks, coupling portions 152 may have a variety of specific configurations as shown and described hereafter with respect to FIGS. 3A–3C.

Figure 3:
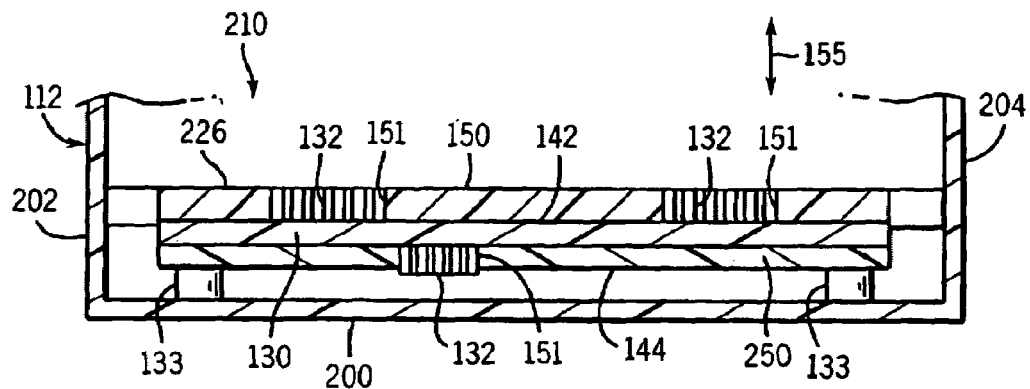
FIG. 3 is a sectional view schematically illustrating a second alternative embodiment of the electronic system of FIG. 1 including a coupling portion.

FIG. 3 illustrates electronic system 210, a second alternative embodiment of system 10. System 210 is similar to system 110 except that system 210 includes backplane stiffener 226 in lieu of backplane stiffener 126. For ease of illustration, those remaining elements of system 210 which correspond to elements of system 110 are numbered similarly. Backplane stiffener 226 is similar to backplane stiffener 126 except that backplane stiffener 226 additionally includes stiffening portion 250. Stiffening portion 250 generally comprises a rigid member sized so as to extend across the entire face 144 of printed circuit board 130 opposite stiffening portion 150. As a result, portions 150 and 250 cooperate to sandwich or capture printed circuit board 130 therebetween. Like stiffening portion 150, stiffening portion 250 has a rigidity or stiffness greater than the rigidity or stiffness of printed circuit board 130.

Stiffening portion 250 is generally maintained in place relative to circuit board 130 by being stationarily coupled to chassis 112 by standoffs 133. Standoffs 133 may have any one of a variety of shapes, sizes or configurations. In one embodiment, standoffs 133 are integrally formed as part of a single unitary body with chassis 112. In still another embodiment, standoffs 133 are integrally formed as part of a single unitary body with stiffening portion 250. Although stiffening portion 250 is illustrated as being a distinct member which is joined to either standoffs 133 or chassis 112, in alternative embodiments, stiffening portion 250 may be integrally formed as part of a single unitary body with both standoffs 133 and chassis 112. As compared to backplane stiffener 126, backplane stiffener 226 supports printed circuit board 130 along both faces 142 and 144, providing greater protection for printed circuit board 130.

Although stiffening portion 250 is illustrated as a substantially continuous imperforate member across face 144 of printed circuit board 130, stiffening portion 250 may have other configurations depending upon the stiffening needed by printed circuit board 130. For example, stiffening portion 250 may alternatively include one or more apertures that extend completely through stiffening portion 250 which are configured to accommodate active or passive components supported by printed circuit board 130. In particular embodiments, stiffening portion 250 may be provided with depressions or cavities facing face 144 to accommodate active or passive components extending along face 144. In still other embodiments in which backplane 114 includes connectors 132 extending from face 144 of printed circuit board 130, stiffening portion 250 may include apertures 151 to facilitate connection to printed circuit board 130. In such applications, standoffs 133 may be increased in size or may alternatively extend between stiffening portion 250 and one or both of walls 202 and 204 of chassis 112 in lieu of wall 200. Alternatively, wall 200 may include openings through which components extend into connection with connector 132 on face 144, or board 130 and stiffener 226 may be reoriented relative to chassis 112. In alternative embodiments, stiffening portion 250 may be stationarily secured relative to chassis 112 by an additional set of coupling portions 152 in lieu of or in addition to standoffs 133. In particular embodiments, one or both of stiffening portions 150 or 250 may include lips that at least partially extend along edges 146 to further retain the printed circuit board 130 in place relative to either one or both of stiffening portions 150, 250.

Figure 3A:
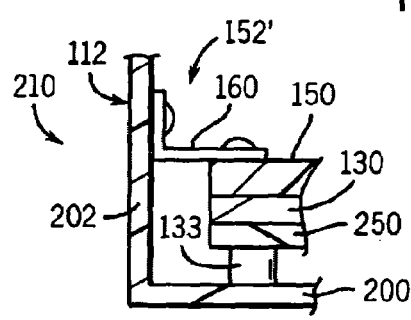
FIG. 3A is a fragmentary sectional view illustrating a first particular embodiment of the coupling portion of FIG. 3.

FIG. 3A illustrates one particular embodiment of coupling portion 152, coupling portion 152', which comprises a metal bracket 160 fastened or otherwise secured to both chassis 112 and stiffening portion 150. Although bracket 160 is illustrated as being fastened to each of stiffening portion 150 and chassis 112, bracket 160 may alternatively be integrally formed as part of a single unitary body with one of stiffening portion 150 and chassis 112.

Figure 3B:
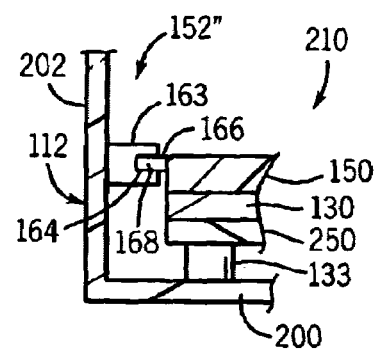
FIG. 3B is a fragmentary sectional view illustrating a second particular embodiment of the coupling portion of FIG. 3.

FIG. 3B illustrates a coupling portion 152" that includes one or more structures 163 coupled to one of chassis 112 and stiffening portion 150 that provide a channel or groove 164 and one or more structures 166 coupled to th other of chassis 112 and stiffening portion 150 that provide a tongue 168 received within the groove 164 to stationarily secure stiffening portion 150 relative to chassis 112 and relative to printed circuit board 130 in the direction indicated by arrows 155 in FIG. 3. In such an application, coupling portions 152 may additionally include other structures for securing stiffening portion 150 against relative movement to printed circuit board 130 in a direction along the plane containing stiffening portion 150.

Figure 3C:
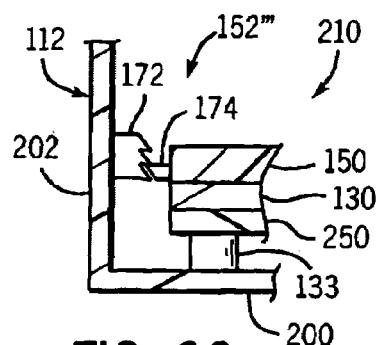
FIG. 3C is a fragmentary sectional view illustrating a third particular embodiment of the coupling portion of FIG. 3.

FIG. 3C illustrates coupling portion 152''' which comprises a ratcheting structure, wherein one of chassis 112 and stiffening portion 150 includes a plurality of teeth 172 spaced from one another in a direction indicated by arrows 155 while the other of chassis 112 and stiffening portion 150 includes a resilient catch, tooth or pawl 174 that engages teeth 172 to ratchet stiffening portion 150 in the direction indicated by arrows 155 in FIG. 3 into a position adjacent to surface 142 of printed circuit board 130. In each of the described variations of coupling portions 152, coupling portions 152 may include members that are integrally formed as part of a single unitary body with one or both of chassis 112 and stiffening portion 150 or that are attached, adhered, welded or otherwise joined to one or both of chassis 112 and stiffening portion 150.

Figure 4:
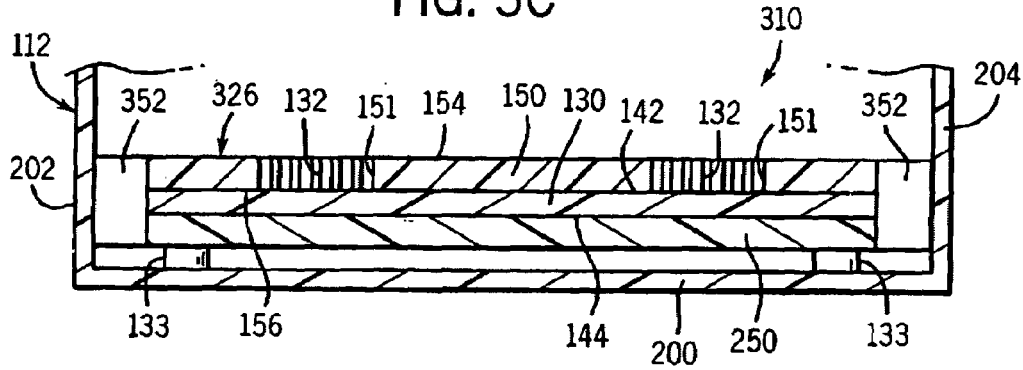
FIG. 4 is a sectional view schematically illustrating a fourth alternative embodiment of the electronic system of FIG. 1 including a coupling portion.

FIG. 4 is a sectional view schematically illustrating electronic system 310, a third alternative embodiment of system 10. System 310 is substantially identical to system 210 shown in FIG. 3 except that both stiffening portions 150 and 250 extend beyond at least portions of perimeter 148 of board 130 and that system 310 additionally includes coupling portions 352. Those remaining elements of system 310 which correspond to system 210 are numbered similarly. Coupling portions 352 generally comprise one or more structures coupled to both stiffening portion 150 and stiffening portion 250. Coupling portions 352, schematically illustrated as boxes, join portions 150 and 250 at points or coupling locations beyond perimeter 148.

Figure 4A:
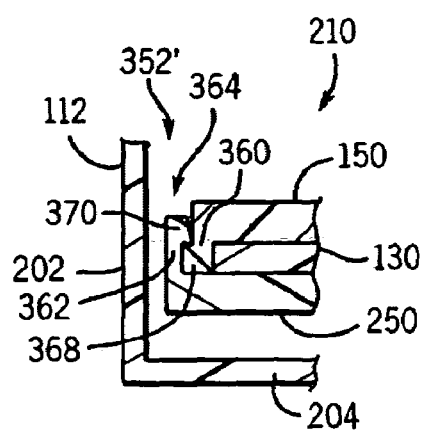
FIG. 4A is a fragmentary sectional view illustrating a first particular embodiment of the coupling portion of FIG. 4.

FIG. 4A illustrates one particular embodiment of coupling portion 352, coupling portion 352', which includes a first extension 360 extending from stiffening portion 150 and a second opposite and overlapping extension 362 extending from stiffening portion 250. Each coupling portion 352 further includes a mechanical interlock 364 configured to releasably connect the opposite extensions 360 and 362. The mechanical interlock 364 includes a snap fit mechanism in which one or both members resiliently flex into snapping interengagement. For example, interlock 364 includes hook 368 and a catch 370 which flex to engage one another. Alternatively, fasteners may be used to releasably connect extensions 360 and 362. The fasteners may comprise screws, bolts, rivets and the like.

Figure 4B:
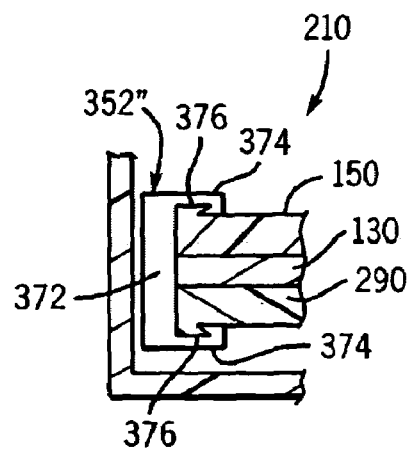
FIG. 4B is a fragmentary sectional view illustrating a second particular embodiment of the coupling portion of FIG. 4.

In particular applications, coupling portions 352 may comprise members that span perimeter 148 and across at least edge portions of stiffening portions 150 and 250, wherein each of coupling portions 352 is releasably coupled to each of stiffening portions 150 and 250. In particular, each coupling portion 352 may be configured to snap into coupling engagement with stiffening portions 150 and 250 along perimeter 148. As shown by FIG. 4B, each coupling portion 352" may include a spanning portion 372 and connection portions 374. Spanning portion 372 extends across the edges of stiffening portions 150 and 250 and across printed circuit board 130. Connecting portions 374 generally comprise hooks which engage opposing hooks 376 coupled to stiffening portions 150 and 250. In such an embodiment, at least one of connecting portions 374 or hooks 376 of stiffening portions 150 and 250 includes elastic or resiliently flexible portions enabling the hooks to be snap fit to one another. Alternatively, fasteners such as screws, bolts and the like may extend through the spanning portion of coupling portion 352 into engagement with each of stiffening portions 150 and 250.

In one embodiment, coupling portions 352 comprise portions of a single coupling mechanism that continuously extends about the entire perimeter 148 of printed circuit board 130. In another embodiment, coupling portions 352 comprise portions of distinct spaced connection mechanisms positioned about perimeter 148 of printed circuit board 130. In one embodiment, coupling portions 352 are arranged opposite one another on perimeter 148. In another embodiment, coupling portions 352 are intermittently spaced about perimeter 148. In such embodiments, coupling portions 352 may be identical to one another or may comprise distinct conventionally known or future developed coupling mechanisms.

Figure 4C:
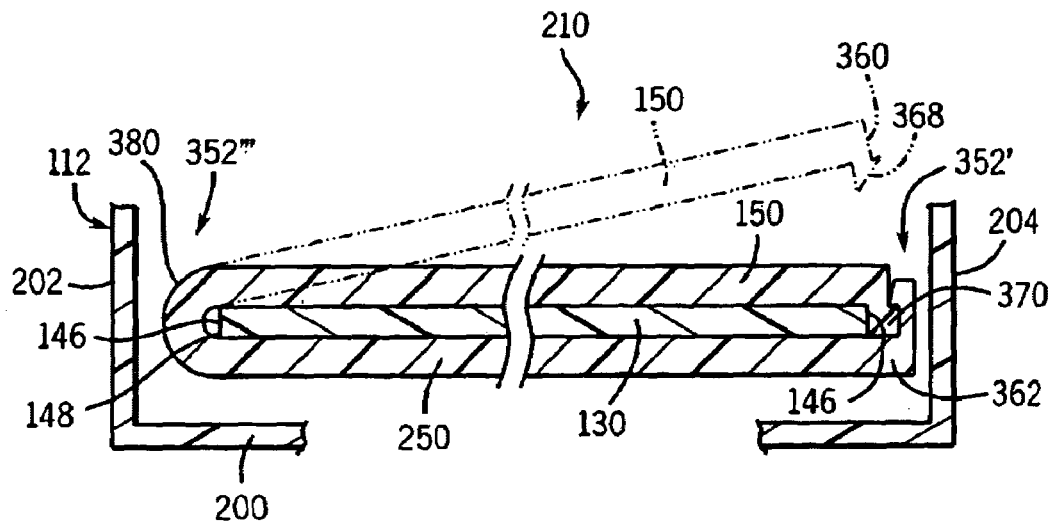
FIG. 4C is a fragmentary sectional view illustrating a third particular embodiment of the coupling portion of FIG. 4.

FIG. 4C illustrates a pair of distinct coupling portions 352''' and 352'. For ease of illustration, portions are shown broken away such that standoffs 133, which retain portions 150 and 250 to chassis 112, are not shown. Coupling portion 352''' is formed from one or more materials, is dimensioned and is shaped so as to function as a living hinge 380, enabling stiffening portions 150 and 250 to be pivoted relative to one another. In another embodiment, coupling portion 352''' may comprise a conventionally known or future developed mechanical hinge, such as with a pivot pin. In one embodiment, one or more portions of coupling portion 352''' are integrally formed as part of a single unitary body with one or both of stiffening portions 150 and 250. In another embodiment, one or more portions of coupling portion 352''' are affixed or attached to one or both of stiffening portions 150 and 250. Such attachment may be by fasteners, welding, bonding and the like.

Coupling portions 352' comprises a latching mechanism facilitating releasable connection of stiffening portion 150 to stiffening portion 250 along another portion of perimeter 148 of printed circuit board 130. In the particular embodiment illustrated, coupling portion 352' is substantially identical to coupling portion 352' shown in FIG. 4A.

Stiffener 326 and backplane 114, together, form a backplane support unit 330. In particular, backplane 114 is positioned between stiffening portions 150 and 250 which sandwich printed circuit board 130 therebetween and which are coupled to one another via coupling portions 352. As a result, stiffener 326 protects printed circuit board 130 and backplane 114 even prior to being positioned within chassis 112. In particular, stiffener 326 may be employed to protect backplane 114 during shipping or storage of the backplane support unit 330. Stiffener 326 may also be employed to protect backplane 114 while backplane support unit 330 is being assembled within chassis 112. Although unit 330 is illustrated as being releasably connected to chassis 112 by standoffs 133, standoffs 133 may be eliminated in embodiments where coupling portions 352 are releasably connected to chassis 112.

Figure 5:
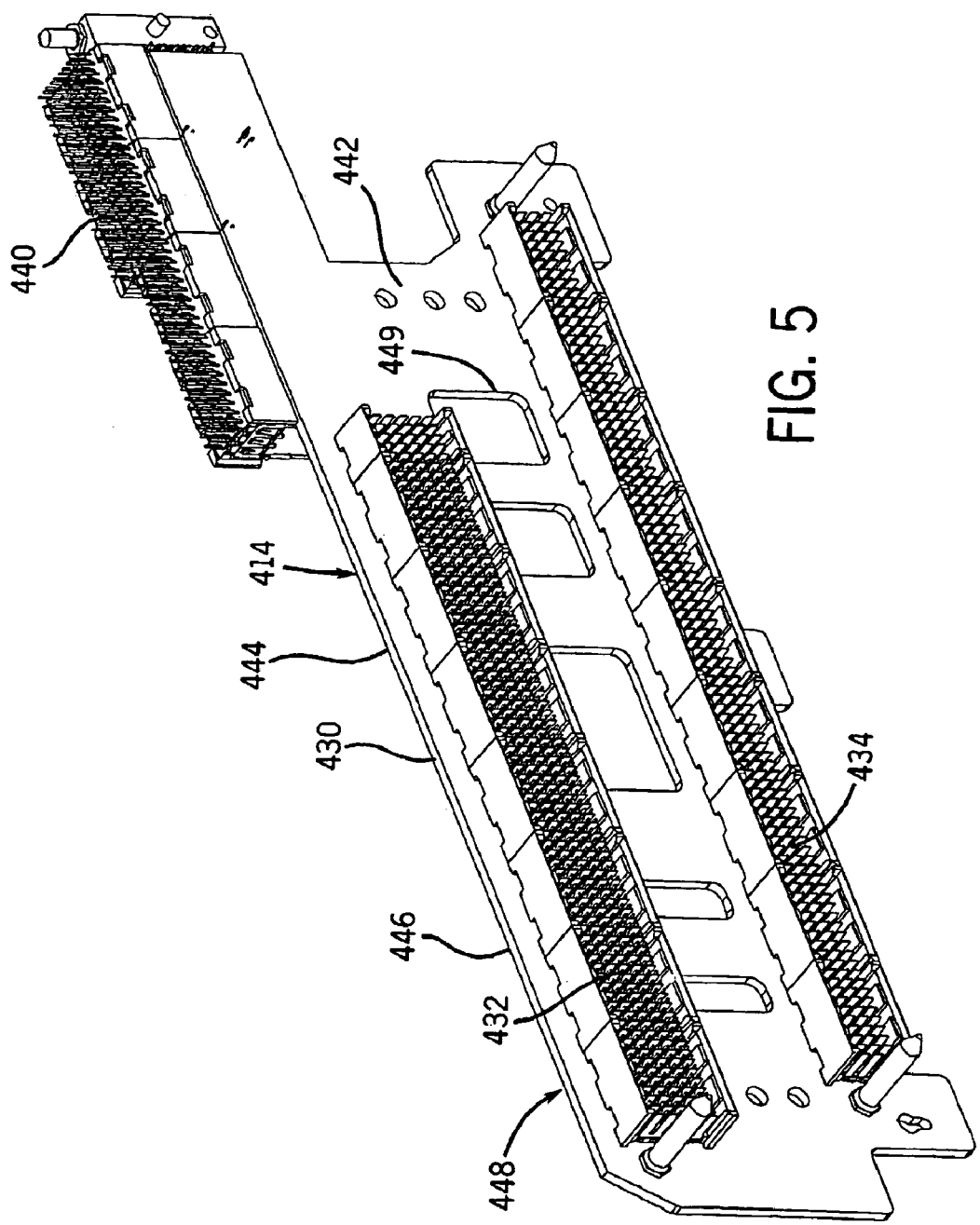
FIG. 5 is a perspective view of a backplane.
Figure 6:
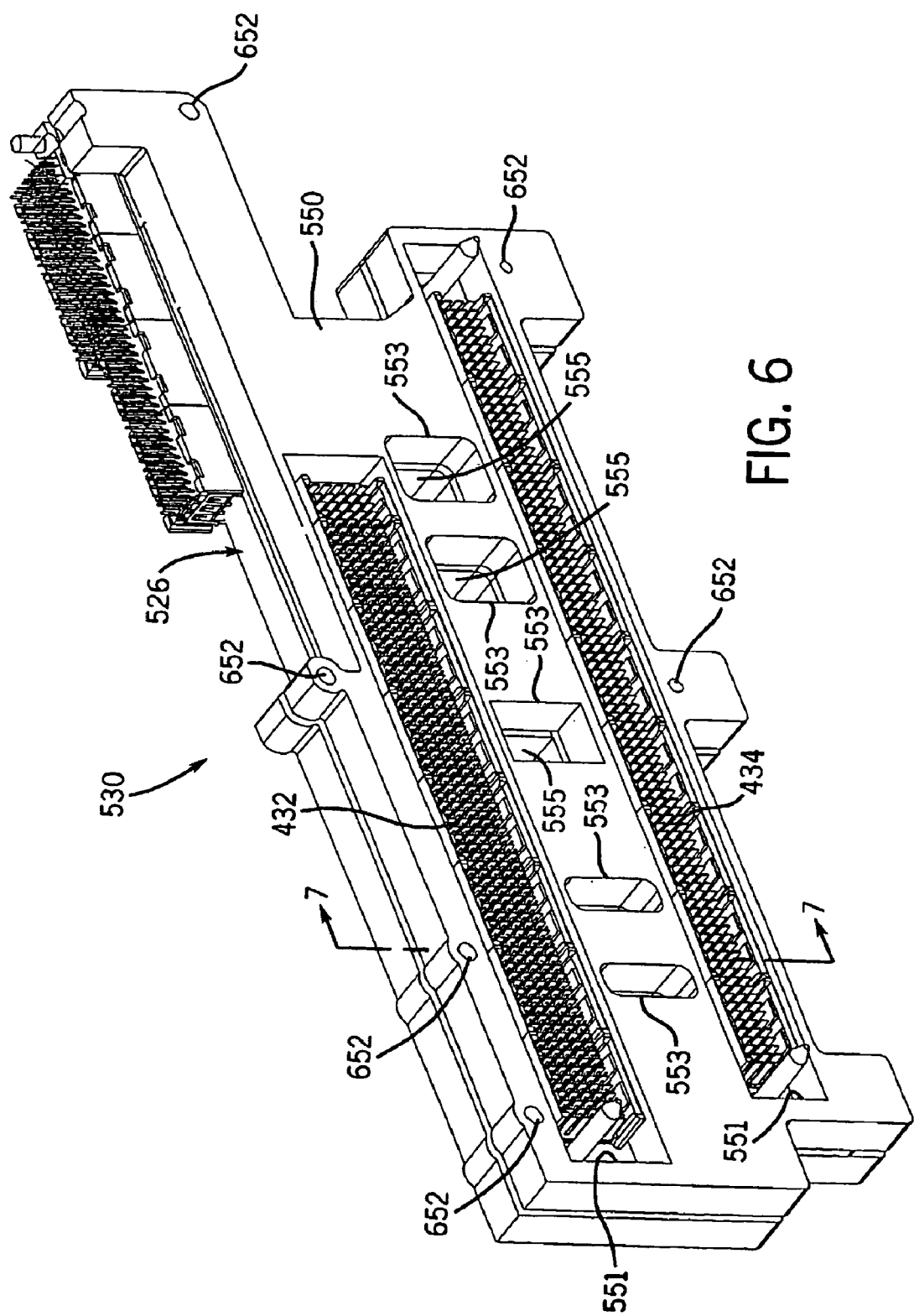
FIG. 6 is a perspective view of the backplane of FIG. 5 positioned between stiffening portions to form a backplane support unit.
Figure 7:
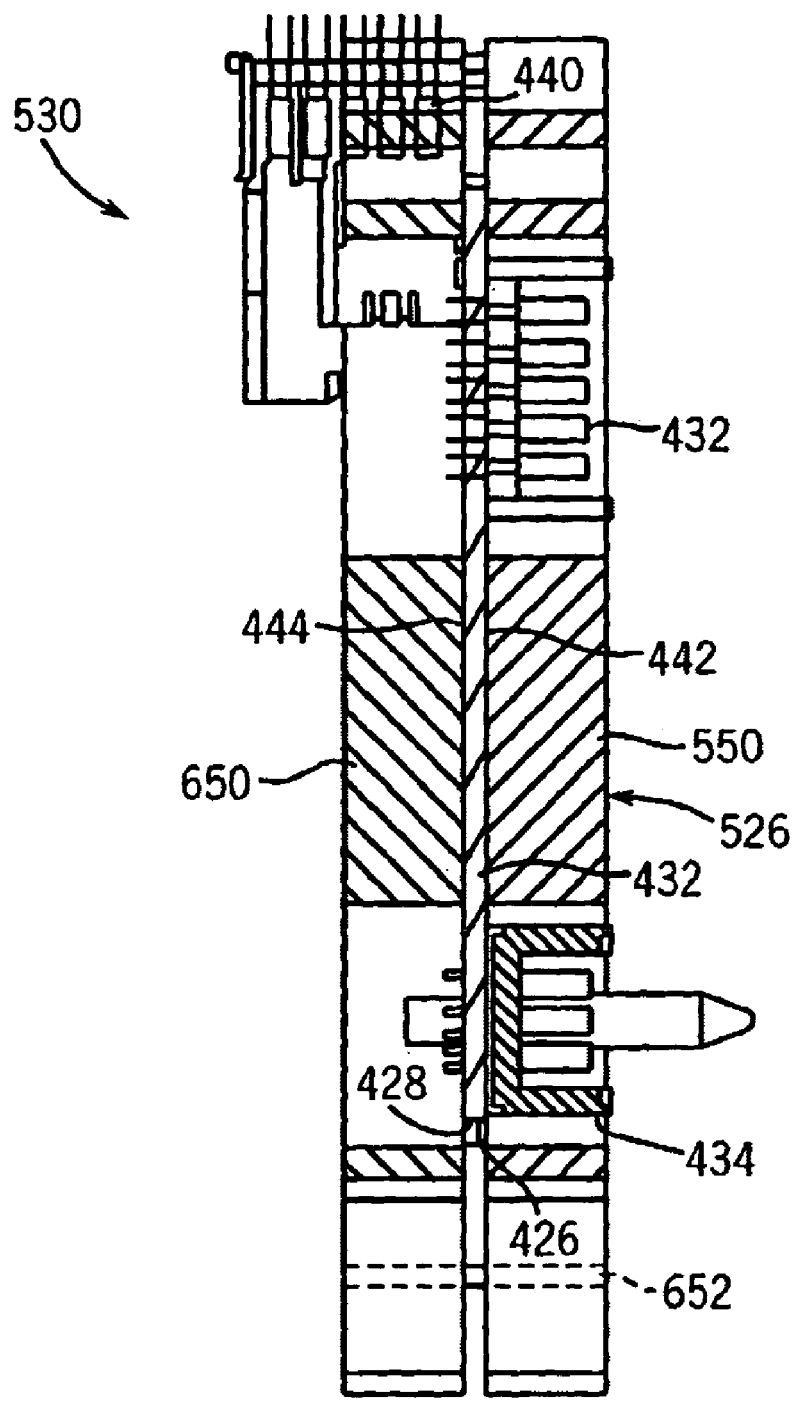
FIG. 7 is a sectional view of the backplane support unit of FIG. 6 taken along line 7—7.

FIGS. 5–7 illustrate a detailed example of a backplane 414 and a detailed example of backplane stiffener 526 positioned adjacent to backplane 414 to form backplane support unit 530. As best shown by FIGS. 5 and 7, backplane 414 includes printed circuit board 430 and connectors 432, 434 and 440. Printed circuit board 430 includes opposite faces 442 and 444 and side edges 446 which form a perimeter 448. As further shown by FIG. 5, printed circuit board 430 additionally includes apertures 449 for facilitating air flow. The exact configuration of printed circuit board 430 may vary depending upon its intended functions.

Connectors 432 and 434 extend from face 442 and are generally configured to connect peripheral system components to printed circuit board 430. In the particular embodiment illustrated, connectors 432 and 434 comprise high density pin connectors such as AMP HS3, 100 signals per linear inch. Connector 440 is connected to face 444 of printed circuit board 430 and extends beyond perimeter 448 in a direction away from and parallel to plane containing printed circuit board 430. Like connectors 432 and 434, connector 440 is illustrated as comprising a high density pin connector configured for connecting system components such as other printed circuit boards, power supplies, fans the like to printed circuit board 430.

As best shown by FIGS. 6 and 7, stiffener 526 includes stiffening portion 550, stiffening portion 650 and coupling portions 652. Stiffening portion 550 is generally a panel configured to extend along face 442 of printed circuit board 430. Stiffening portion 550 has a stiffness greater than a stiffness of printed circuit board 430. In the particular embodiment illustrated, at least one of stiffening portion 550 and stiffening portion 650 has a stiffness such that for known insertion forces, the backplane will not flex such that it or board 130 is damaged or the connectors bind. The necessary rigidity will vary given the connectors used, the span between support points, and the insertion and extraction forces generated by the connectors. Stiffening portion 550 includes connector apertures 551 and cooling apertures 553. Connector apertures 551 extend completely through stiffening portion 550 and are sized and located to receive connectors 432 and 434. As a result, extension 550 enables peripherals and other components to be connected to backplane 414 via connectors 432 and 434.

Cooling apertures 553 extend completely through stiffener portion 550 and are in general alignment with apertures 449 of printed circuit board 430 when stiffening portion 550 is assembled as part of unit 530. Openings 553 permit air to pass through stiffening portion 550 and through printed circuit board 430. In alternative embodiments, apertures 553 may be aligned over one or more heat generating components upon printed circuit board 430 that require cooling.

Stiffening portion 650 generally comprises a rigid or stiff member configured to extend along face 444 of printed circuit board 430 opposite stiffening portion 550. Stiffening portion 650 has a rigidity or stiffness greater than the rigidity or stiffness of printed circuit board 430. Like stiffener portion 550, stiffener portion 660 includes cooling apertures 555 which extend completely through stiffening portion 650 and which are in general alignment with apertures 449 of printed circuit board 430. As a result, a continuous air flow passageway is provided through unit 430. In alternative embodiments, apertures 555 may be positioned in alignment with other portions of printed circuit board 430 or backplane 414 that require air flow for cooling or other reasons.

As best shown by FIG. 7, stiffener portions 550 and 650 each include portions that extend beyond at least portions of perimeter 448 of printed circuit board 430 and that extend opposite one another so as to overlap one another. Coupling portions 652 join stiffening portions 550 and 650 together beyond perimeter 448. In the particular embodiment illustrated, coupling portions 652 comprise fasteners, such as rivets, screws, bolts and the like, which extend through those portions of both stiffening portion 550 and stiffening portion 650 that extend beyond perimeter 448. The overall assembled unit 530 is releasably coupled to a chassis within th chassis by standoffs or other mounting structures (not shown).

Overall, backplane stiffeners 26, 126, 226, 326 and 526 each rigidify and support an adjacent printed circuit board of a backplane without requiring or at least reducing the number of perforations or holes passing through the printed circuit board for the purpose of retaining the stiffening member adjacent to the printed circuit board. By reducing or completely eliminating the number of apertures passing through the circuit board, each stiffener facilitates denser routing of communication lines, such as electrically conductive traces. In addition, stress within the printed circuit board created by fasteners extending through mounting holes within the printed circuit board are eliminated or reduced.

Although the present invention has been described with reference to example embodiments, workers skilled in the art will recognize that changes may be made in form and detail without departing from the spirit and scope of the invention. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. A backplane support system comprising:
 a backplane including:
  a planar printed circuit board extending in a first plane and having a first face, a second opposite face, and a perimeter having at least three sides; and
  at least one connector extending from the printed circuit board; and
 a backplane stiffener including:
  a first planar portion extending parallel to and across the first face; and
  a second opposite planar portion extending parallel to and across the second face, wherein the first portion and the second portion extend beyond at least three of the sides, wherein the first portion is coupled to the second portion beyond the perimeter, and wherein the printed circuit board includes a first aperture, wherein the first portion includes a second aperture in alignment with the first aperture and wherein the second portion includes a third aperture in alignment with the first aperture such that the first aperture, the second aperture and the third aperture an airflow path through the backplane and the backplane stiffener.

2. The system of claim 1, wherein the printed circuit board has a perimeter and wherein the first portion is coupled to the second portion beyond the perimeter.

3. The system of claim 1 including at least one fastener connecting the first portion and the second portion beyond the perimeter.

4. The system of claim 3, wherein at least one of the first portion and the second portion includes at least one hole beyond the perimeter, wherein the at least one fastener extends through the at least one hole.

5. The system of claim 1, wherein the perimeter includes a first side and a second opposite side and wherein the first portion is coupled to the second portion at a first connector location beyond the first side and at a second connector location beyond the second side.

6. The system of claim 1, wherein the at least one connector includes a first connector and wherein the first portion includes a first aperture into which the first connector extends.

7. The system of claim 6, wherein the at least one connector includes a second connector and wherein the first portion includes a second aperture into which the second connector extends.

8. The system of claim 7, wherein the first aperture is completely surrounded by the first portion.

9. The system of claim 8, wherein the second aperture is completely surrounded by the first portion.

10. The system of claim 6, wherein the first aperture is completely surrounded by the first portion.

11. The system of claim 1, wherein the first portion is configured to be releasably coupled to the chassis.

12. The system of claim 11, wherein the second portion is configured to be releasably coupled to the chassis.

13. The system of claim 1, wherein the first portion and the second portion are retained relative to one another and the printed circuit board without requiring perforation of the printed circuit board.

14. The system of claim 13, wherein the printed circuit board has a perimeter and wherein the first portion is coupled to the second portion only at coupling locations beyond the perimeter.

15. The system of claim 13, wherein the first portion and the second portion are configured to be fixedly coupled to a chassis so as to be retained relative to one another on opposite sides of the printed circuit board.

16. The system of claim 1, wherein the printed circuit board includes a face and wherein the first portion includes at least one aperture adjacent an area of the face.

17. The system of claim 1, wherein the printed circuit board includes a face and wherein the first portion includes a first aperture adjacent a first area of the face and a second aperture adjacent a second area of the face.

18. The system of claim 17, wherein the first aperture is completely surrounded by the first portion and wherein the second aperture is completely surrounded by the first portion.

19. The system of claim 1, wherein the first portion includes at least one aperture into which the at least one connector extends from the printed circuit board and wherein the first portion includes at least one of a recess and a projection configured to facilitate alignment of at least one external connector to the at least one connector in the aperture.

20. The system of claim 1, wherein the printed circuit board generally extends in a first plane and wherein the first portion and the second portion extend in second and third planes, respectively, which are parallel to one another and to the first plane.

21. The system of claim 1, wherein the first portion and the second portion substantially coextensively extend on opposite sides faces of the printed circuit board.

22. The system of claim 1, wherein the printed circuit board includes a perimeter edge between the first face and the second face and wherein the stiffener includes a coupling portion coupled to the first portion and the second portion and extending opposite the perimeter edge.

23. The system of claim 22, wherein the coupling portion is integrally formed as part of a single unitary body with the first portion and the second portion.

24. The system of claim 1, wherein the first portion is moveably coupled to the second portion for movement between an open position facilitating insertion of the printed circuit board between the first portion and the second portion and a closed position.

25. The system of claim 24, wherein the first portion pivots between the open position and the closed position.

26. The system of claim 1, wherein the at least one connector is configured to mate with at least one corresponding connector and wherein the backplane stiffener has a rigidity such that the stiffener will not flex to a degree where the at least one connector binds with the at least one corresponding mating connector during mating or unmating.

27. The system of claim 1, wherein the at least one connector is configured to mate with at least one corresponding connector and wherein the stiffener has a sufficient rigidity so as not to flex to a degree that the printed circuit board is damaged.

28. The system of claim 1 including at least one second connector perpendicularly extending relative to the at least one connector.

29. The system of claim 1, wherein the first portion and the second portion are configured to be coupled to one another without additional fasteners or adhesive.

30. An electronic system comprising:
a chassis having a wall;
a planar backplane having a printed circuit board with a perimeter, a and a second opposite face facing the wall and at least one connector extending from the first face of the printed circuit board;
a backplane stiffener including a first planar portion adjacent and parallel the first face of the printed circuit board and a second portion adjacent and parallel to the second face of the printed circuit board, wherein the printed circuit board is between the chassis and the first portion and wherein the first portion is stationarily retained relative to the printed circuit board and the chassis without requiring perforation of the printed circuit board, wherein the first portion and the second portion are coupled to one another beyond the perimeter; and
at least one standoff extending from the second portion of the stiffener and spacing the second portion from the wall.

31. The system of claim 30, wherein the first portion and the second portion are held adjacent the printed circuit board by the chassis.

32. The system of claim 30, wherein the printed circuit board has a perimeter and wherein the first portion is coupled to the second portion only at connector locations beyond the perimeter.

33. The system of claim 32, wherein one of the first portion and the second portion is releasably coupled to the chassis.

34. The system of claim 32 including at least one fastener connecting the first portion and the second portion beyond the perimeter.

35. The system of claim 34, wherein at least one of the first portion and the second portion includes at least one hole beyond the perimeter, wherein the at least one fastener extends through the at least one hole.

36. The system of claim 30, wherein the perimeter includes a first side and a second opposite side and wherein the first portion is coupled to the second portion at a first connector location beyond the first side at a second connector location beyond the second side.

37. The system of claim 30, wherein the at least one connector includes a first connector and wherein the first portion includes a first aperture into which the first connector extends.

38. The system of claim 37, wherein the at least one connector includes a second connector and wherein the first portion includes a second aperture into which the second connector extends.

39. The system of claim 38, wherein the first aperture is completely surrounded by the first portion.

40. The system of claim 39, wherein the second aperture is completely surrounded by the first portion.

41. The system of claim 37, wherein the first aperture is completely surrounded by the first portion.

42. The system of claim 30, wherein the printed circuit board includes a face and wherein the first portion includes a first aperture adjacent a first area of the face and a second aperture adjacent a second area of the face.

43. The system of claim 42, wherein the first aperture is completely surrounded by the first portion and wherein the second aperture is completely surrounded by the first portion.

44. The system of claim 30, wherein the first portion includes at least one aperture into which the at least one connector extends from the printed circuit board and wherein the first portion includes at least one of a recess and a projection configured to facilitate alignment of at least one external connector to the at least one connector in the aperture.

45. The system of claim 30, wherein the printed circuit board generally extends in a first plane and wherein the first portion and the second portion extend in second and third planes, respectively, which are parallel to one another and to the first plane.

46. The system of claim 30, wherein the first portion and the second portion substantially coextensively extend on opposite sides of the printed circuit board.

47. The system of claim 30, wherein the printed circuit board includes a perimeter edge between the first face and the second face and wherein the stiffener includes a coupling portion coupled to the first portion and the second portion and extending opposite the perimeter edge.

48. The system of claim 47, wherein the coupling portion is integrally formed as part of a single unitary body with the first portion and the second portion.

49. The system of claim 47, wherein the first portion is moveably coupled to the second portion for movement between an open position facilitating insertion of the printed circuit board between the first portion and the second portion and a closed position.

50. The system of claim 49, wherein the first portion pivots between the open position and the closed position.

51. The system of claim 30, wherein the at least one connector is configured to mate with at least one corresponding connector and wherein the backplane stiffener has a rigidity such that the stiffener will not flex to a degree where the at least one connector binds with the at least one corresponding mating connector during mating or unmating.

52. The system of claim 30, wherein the at least one connector is configured to mate with at least one corresponding connector and wherein the stiffener has a sufficient rigidity so as not to flex to a degree that the printed circuit board is damaged.

53. The system claim 30, wherein the at least one standoff is integrally formed as part of a single unitary body with the second portion of the stiffener.

54. A backplane stiffener for use with a backplane having a printed circuit board with a first face, a second face and a perimeter defined by at least three sides and at least one connector extending from the first face the printed circuit board, the stiffener comprising:
a first planar portion configured to extend across the first face, parallel to the first face and beyond at least three of the sides; and
a second opposite planar portion configured to extend across the second face, parallel to the second face and beyond at least three of the sides, wherein the first portion and the second portion are configured to be coupled to one another beyond the perimeter and to cooperate with one another so as to receive the printed circuit board therebetween, wherein the printed circuit board includes a first face, a second opposite face and a perimeter edge between the first face and the second face and wherein the stiffener includes a coupling portion coupled to the first portion and the second portion and extending opposite the perimeter edge and wherein the first portion is moveably coupled to the second portion for movement between an open position facilitating insertion of the printed circuit board between the first portion and the second portion and a closed position.

55. The stiffener of claim 54 including at least one fastener configured to connect the first portion and the second portion beyond the perimeter.

56. The stiffener of claim 55, wherein at least one of the first portion and the second portion includes at least one hole located so as to extend beyond the perimeter of the backplane when the printed circuit board is positioned between the first portion and the second portion, wherein the at least one fastener extends through the at least one hole.

57. The stiffener of claim 54, wherein the printed circuit board includes a first side and a second opposite side and wherein the first portion and the second portion are configured to be coupled to one another at a first connector location beyond the first side and at a second connector location beyond the second side when the printed circuit board is positioned between the first portion and the second portion.

58. The stiffener of claim 54, wherein the at least one connector includes a first connector and wherein the first portion includes a first aperture configured to receive the first connector.

59. The stiffener of claim 58, wherein the at least one connector includes a second connector and wherein the first portion includes a second aperture configured to receive the second connector when the printed circuit board is positioned between the first portion and the second portion.

60. The stiffener of claim 59, wherein the first aperture is completely surrounded by the first portion.

61. The stiffener of claim 60, wherein the second aperture is completed surrounded by the first portion.

62. The stiffener of claim 59, wherein the first aperture is completely surrounded by the first portion.

63. The stiffener of claim 54, wherein the first portion and the second portion are configured to be fixedly coupled to a chassis so as to be retained relative to one another and to the printed circuit board positioned between the first portion and the second portion.

64. The stiffener of claim 54, wherein the first portion includes at least one aperture adjacent an area of the first face.

65. The stiffener of claim 54, wherein the first portion includes a first aperture adjacent a first area of the first face and a second aperture adjacent a second area of the first face.

66. The stiffener of claim 65, wherein the first aperture is completely surrounded by the first portion and wherein the second aperture is completely surrounded by the first portion.

67. The stiffener of claim 54, wherein the printed circuit board generally extends in a first plane and wherein the first portion and the second portion extend in second and third planes, respectively, which are parallel to one another and to the first plane.

68. The system of claim 54, wherein the first portion and the second portion substantially coextensively extend on opposite sides of the printed circuit board.

69. The system of claim 54, wherein the coupling portion is integrally formed as part of a single unitary body with the first portion and the second portion.

70. The system of claim 54, wherein the first portion pivots between the open position and the closed position.

71. The stiffener of claim 54, wherein the at least one connector is configured to mate with at least one corresponding connector and wherein at least one of the first portion and the second portion of the backplane stiffener has a rigidity such that the stiffener will not flex to a degree where the at least one connector binds with the at least one corresponding mating connector during mating or unmating.

72. The stiffener of claim 54, wherein the at least one connector is configured to mate with at least one corresponding connector and wherein at least one of the first portion and the second portion of the stiffener has a sufficient rigidity so as not to flex to a degree that the printed circuit board is damaged.

73. A method for assembling a backplane having a printed circuit board with a first face, a second opposite face and a perimeter including at least three sides in a chassis of an electronic system, the method comprising:
    providing a first surface formed as part of or coupled to the chassis;
    positioning the first face of the printed circuit board against the first surface such that the first surface extends beyond at least three of the sides;
    pivoting a second surface about a hinge against the second face of the printed circuit board such that the second surface extends beyond at least three of the sides;
    connecting the first surface to the second surface beyond the perimeter; and
    stationarily coupling the second surface to at least one of the chassis and the first surface.

74. The method of claim 73 including connecting a first member providing the first surface to a second member providing the second surface.

75. The method of claim 73 including coupling a member providing the second surface to the chassis.

76. A backplane support system comprising:
    a backplane including:
    a planar printed circuit board having a first face and a second opposite face;
    at least one connector extending from the first face of the printed circuit board; and
    a backplane stiffener including:
    a first portion extending across the first face and having an opening into which the at least one connector projects; and
    a second opposite portion extending across the second face and pivotally coupled to the first portion.

77. The system of claim 76, wherein the first portion and the second portion are integrally formed as part of a single unitary body.

78. A backplane support system comprising:
    a backplane including:
    a planar printed circuit board extending in a first plane and having a first face, a second opposite face, and a perimeter having at least three sides; and
    at least one connector extending from the printed circuit board; and
    a backplane stiffener including:
    a first planar portion extending parallel to and across the first face; and
    a second opposite planar portion extending parallel to and across the second face, wherein the first portion and the second portion extend beyond at least three of the sides, and wherein the first portion is coupled to the second portion beyond the perimeter, wherein the printed circuit board includes a perimeter edge between the and the second face and wherein the stiffener includes a coupling portion coupled to the first portion and the second portion and extending opposite the perimeter edge and wherein the coupling portion is integrally formed as part of a single unitary body with the first portion and the second portion.

79. A backplane support system comprising:
    a backplane including:
    a planar printed circuit board extending in a first plane and having a first face, a second opposite face, and a perimeter having at least three sides; and at least one connector extending from the printed circuit board; and
    a backplane stiffener including:
    a first planar portion extending parallel to and across the first face; and
    a second opposite planar portion extending parallel to and across the second face, wherein the first portion and the second portion extend beyond at least three of the sides, and wherein the first portion is coupled to the second portion beyond the perimeter and wherein the first portion is moveably coupled to the second portion for movement between an open position facilitating insertion of the printed circuit board between the first portion and the second portion and a closed position.

80. An electronic system comprising:
    a chassis having a wall;
    a planar backplane having a printed circuit board with a perimeter, a and a second opposite face facing the wall and at least one connector extending from the first face of the printed circuit board;

a backplane stiffener including a first planar portion adjacent and parallel the first face of the printed circuit board and a second portion adjacent and parallel to the second face of the printed circuit board, wherein the printed circuit board is between the chassis and the first portion and wherein the first portion is stationarily retained relative to the printed circuit board and the chassis without requiring perforation of the printed circuit board, wherein the first portion and the second portion are coupled to one another beyond the perimeter; and at least one standoff spacing the second portion from the wall, wherein the first portion and the second portion are held adjacent the printed circuit board by the chassis.

* * * * *

UNITED STATES PATENT AND TRADEMARK OFFICE
CERTIFICATE OF CORRECTION

PATENT NO. : 7,095,622 B2  Page 1 of 1
APPLICATION NO. : 10/458932
DATED : August 22, 2006
INVENTOR(S) : Stephan K. Barsun et al.

It is certified that error appears in the above-identified patent and that said Letters Patent is hereby corrected as shown below:

On the face page, in field (57), under "Abstract", in column 2, line 11, delete "ioined" and insert -- joined --, therefor.

In column 7, line 21, delete "th" and insert -- the --, therefor.

In column 10, line 20, delete "th" and insert -- the --, therefor.

In column 12, line 12, in Claim 21, after "opposite" delete "sides".

In column 12, line 48, in Claim 30, insert -- first face -- before "and".

In column 14, line 17, in Claim 53, after "system" insert -- of --.

In column 15, line 6, in Claim 61, delete "completed" and insert -- completely --, therefor.

In column 16, line 36, in Claim 78, insert -- first face -- before "and".

In column 16, line 65, in Claim 80, insert -- first face -- before "and".

Signed and Sealed this

Twelfth Day of January, 2010

David J. Kappos
*Director of the United States Patent and Trademark Office*